United States Patent
Mizuno

(10) Patent No.: US 9,818,984 B2
(45) Date of Patent: Nov. 14, 2017

(54) ORGANIC ELECTROLUMINESCENCE ELEMENT, IMAGE-FORMING APPARATUS, DISPLAY APPARATUS, AND IMAGING APPARATUS

(71) Applicant: CANON KABUSHIKI KAISHA, Tokyo (JP)

(72) Inventor: Nobutaka Mizuno, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 151 days.

(21) Appl. No.: 14/762,903

(22) PCT Filed: Mar. 25, 2014

(86) PCT No.: PCT/JP2014/059387
§ 371 (c)(1),
(2) Date: Jul. 23, 2015

(87) PCT Pub. No.: WO2014/171313
PCT Pub. Date: Oct. 23, 2014

(65) Prior Publication Data
US 2015/0372258 A1    Dec. 24, 2015

(30) Foreign Application Priority Data
Apr. 15, 2013  (JP) .................. 2013-084661

(51) Int. Cl.
*H01L 29/08* (2006.01)
*H01L 51/52* (2006.01)
(Continued)

(52) U.S. Cl.
CPC .......... *H01L 51/5275* (2013.01); *G03B 17/18* (2013.01); *G03G 15/04036* (2013.01);
(Continued)

(58) Field of Classification Search
CPC .................... H01L 51/5275; H01L 2251/5315
See application file for complete search history.

(56) References Cited

U.S. PATENT DOCUMENTS 7,528,859 B2    5/2009 Yokoyama et al.
7,538,487 B2    5/2009 Hasegawa et al.
(Continued)

FOREIGN PATENT DOCUMENTS

| JP | 2002-289358 A | 10/2002 |
| JP | 2007-189195 A | 7/2007 |

(Continued)

OTHER PUBLICATIONS

S. Nowy et. al., "Light Extraction and Optical Loss Mechanisms in Organic Light-Emitting Diodes: Influence of the Emitter Quantum Efficiency," J. Appl. Phys., vol. 104, pp. 123109-1-123109-9 (2008).

(Continued)

*Primary Examiner* — Bumsuk Won
*Assistant Examiner* — Jacob R Stern
(74) *Attorney, Agent, or Firm* — Fitzpatrick, Cella, Harper & Scinto

(57) ABSTRACT

Provided is an organic electroluminescence element improved in emission efficiency. The organic electroluminescence element includes: a reflective electrode; a light exiting side electrode; an emission layer provided between the reflective electrode and the light exiting side electrode; and at least one low-refractive index layer provided between the reflective electrode and the emission layer, the low-refractive index layer having a refractive index lower than the refractive index of the emission layer. An optical path $L_1$ between the maximum emission surface of the emission layer and the reflection surface of the reflective electrode, and an optical path $L_2$ between the reflection interface on an emission layer side of the low-refractive index layer and the (Continued)

maximum emission surface of the emission layer satisfy specific expressions.

15 Claims, 6 Drawing Sheets

(51) Int. Cl.
    *G03G 15/04*     (2006.01)
    *G03B 17/18*     (2006.01)
    *H01L 51/50*     (2006.01)
    *H05B 33/24*     (2006.01)
    *H01L 51/00*     (2006.01)

(52) U.S. Cl.
    CPC ... *G03G 15/04045* (2013.01); *H01L 51/5056* (2013.01); *H01L 51/5072* (2013.01); *H01L 51/5088* (2013.01); *H01L 51/5092* (2013.01); *H01L 51/5218* (2013.01); *H01L 51/0054* (2013.01); *H01L 51/0059* (2013.01); *H01L 51/0072* (2013.01); *H01L 2251/55* (2013.01); *H01L 2251/558* (2013.01); *H05B 33/24* (2013.01)

(56) References Cited

U.S. PATENT DOCUMENTS

| | | | |
|---|---|---|---|
| 8,471,463 B2 | 6/2013 | Sumida et al. | |
| 8,482,195 B2 | 7/2013 | Mizuno | |
| 8,530,888 B2 | 9/2013 | Jeong et al. | |
| 8,916,856 B2 * | 12/2014 | Ishizuya | H01L 51/5064 257/40 |
| 2007/0148494 A1 | 6/2007 | Kambe et al. | |
| 2008/0131166 A1 | 6/2008 | Yokoyama et al. | |
| 2010/0283385 A1 | 11/2010 | Maeda et al. | |
| 2011/0084896 A1 | 4/2011 | Ito et al. | |
| 2011/0101855 A1 | 5/2011 | Mizuno | |
| 2011/0204342 A1 | 8/2011 | Jeong et al. | |
| 2012/0211782 A1 | 8/2012 | Matsuda et al. | |
| 2014/0299854 A1 | 10/2014 | Mizuno | |

FOREIGN PATENT DOCUMENTS

| | | |
|---|---|---|
| JP | 2008-165195 A | 7/2008 |
| JP | 2010-263155 A | 11/2010 |
| JP | 2011-100715 A | 5/2011 |
| JP | 2011-119233 A | 6/2011 |
| JP | 2011-175952 A | 9/2011 |
| JP | 2013-30585 A | 2/2013 |
| NO | 2011/055440 A1 | 5/2011 |
| WO | 2006/018914 A1 | 2/2006 |

OTHER PUBLICATIONS

Office Action issued in Japanese Patent App. No. 2013-084661 dated Apr. 4, 2017 (7 pages including translation).

* cited by examiner

ORGANIC ELECTROLUMINESCENCE ELEMENT, IMAGE-FORMING APPARATUS, DISPLAY APPARATUS, AND IMAGING APPARATUS

TECHNICAL FIELD

The present invention relates to an organic electroluminescence (EL) element, and an image-forming apparatus, a display apparatus, and an imaging apparatus each using the element.

BACKGROUND ART

In recent years, an organic EL element that spontaneously emits light at a driving voltage as low as about several volts has been attracting attention. The organic EL element has excellent features such as surface emitting characteristics, a light weight, and visibility. Accordingly, the element has been used as a thin display, lighting equipment, or a head-mounted display in order that those excellent features may be exploited.

By the way, an organic EL element constituting a pixel in an organic EL display apparatus is of a structure in which a pair of electrodes and a functionally separated organic compound layer each having a thickness of several tens of nanometers to several hundreds of nanometers are laminated. In addition, the thickness of each layer constituting the organic EL element is comparable to the wavelength of light and hence the organic EL element has the following property. Its emission efficiency largely changes owing to an influence of optical interference depending on the construction of the element. It is to be noted that an improvement in emission efficiency can reduce the power consumption of an apparatus using the organic EL element (such as a display).

As described above, the emission efficiency of the organic EL element is strongly affected by the optical interference, and hence the emission efficiency of the organic EL element largely fluctuates depending on the refractive index and thickness of the organic compound layer. However, no specific technology or approach for the optimization of the emission efficiency of the organic EL element through the utilization of the thickness and refractive index of the organic compound layer provided between the pair of electrodes has been established. However, the behavior of light in an organic EL element can be calculated by an optical simulation introduced in, for example, Non Patent Literature 1. Calculation methods for the reflectance, transmittance, phase shift, and the like of an optical multilayer thin film have also been known.

Meanwhile, an approach to introducing a low-refractive index layer between an electrode and an emission layer has been disclosed. Patent Literature 1 proposes, for example, the following approach for the purpose of improving the emission efficiency of an organic EL element. An organic compound layer is placed between a hole injection layer and a hole transport layer, the organic compound layer having a refractive index smaller than that of each adjacent layer. In addition, Patent Literature 2 discloses that when a hole transport layer constituting a blue-light-emitting element is of a construction formed of two layers having different refractive indices, the emission efficiency of the element changes depending on a thickness ratio between the two hole transport layers.

CITATION LIST

Patent Literature

PTL 1: Japanese Patent Application Laid-Open No. 2011-175952
PTL 2: Japanese Patent Application Laid-Open No. 2010-263155

Non Patent Literature

NPL 1: S. Nowy et. al., Journal of Applied Physics 104, 123109 (2008)

SUMMARY OF INVENTION

The present invention has been accomplished to solve the problems and is directed to providing an organic EL element improved in emission efficiency.

An organic EL element of the present invention includes: a reflective electrode; a light exiting side electrode; an emission layer provided between the reflective electrode and the light exiting side electrode; and at least one low-refractive index layer provided between the reflective electrode and the emission layer, the low-refractive index layer having a refractive index lower than a refractive index of the emission layer, in which: an optical path $L_1$ between a maximum emission surface of the emission layer and a reflection surface of the reflective electrode satisfies the following expression (1):

$$\left(4m - 1 - \frac{\phi}{90}\right) \times \left(\frac{\lambda}{8}\right) < L_1 < \left(4m + 1 - \frac{\phi}{90}\right) \times \left(\frac{\lambda}{8}\right) \quad (1)$$

in the expression (1), $\lambda$ represents a maximum peak wavelength of an emission spectrum, $\phi$ represents a phase shift [deg] on the reflection surface of the reflective electrode, and m represents a positive integer; an optical path $L_2$ between an interface on an emission layer side of the low-refractive index layer closest to the emission layer and the maximum emission surface of the emission layer satisfies the following expression (2):

$$(4p - 1) \times \frac{\lambda}{8} < L_2 < (4p + 1) \times \frac{\lambda}{8} \quad (2)$$

in the expression (2), $\lambda$ represents the maximum peak wavelength of the emission spectrum and p represents 0 or a positive integer; and a relationship of p=0 is satisfied in the expression (2).

Further features of the present invention will become apparent from the following description of exemplary embodiments with reference to the attached drawings.

DESCRIPTION OF EMBODIMENTS

Figure 1:
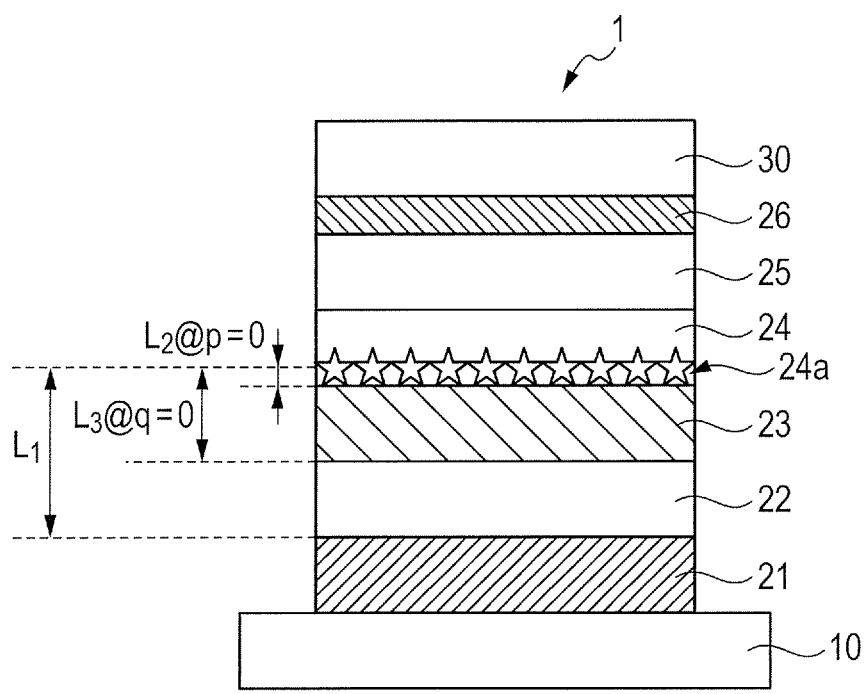
FIG. 1 is a schematic sectional view illustrating a first embodiment in an organic EL element of the present invention.

An organic EL element of the present invention includes: a reflective electrode; a light exiting side electrode; an emission layer provided between the reflective electrode and the light exiting side electrode; and at least one low-refractive index layer provided between the reflective electrode and the emission layer, the low-refractive index layer having a refractive index lower than the refractive index of the emission layer. In the present invention, the refractive index of the low-refractive index layer is lower than the refractive index of the emission layer by preferably 0.1 or more, more preferably 0.2 or more.

In the present invention, the low-refractive index layer has a function as a charge injection/transport layer, but the number of low-refractive index layers to be provided between the emission layer and the reflective electrode is not particularly limited. In other words, the low-refractive index layer to be provided between the emission layer and the reflective electrode may be one layer, or may be two or more layers. In addition, when two or more low-refractive index layers are provided, a high-refractive index layer having a refractive index equal to or higher than the refractive index of the emission layer may be disposed between the multiple low-refractive index layers so as to be in contact with the respective low-refractive index layers. The refractive index of the high-refractive index layer is higher than the refractive index of each low-refractive index layer by preferably 0.1 or more, more preferably 0.2 or more.

It is to be noted that when two or more low-refractive index layers are provided between the emission layer and the reflective electrode in the following description, the low-refractive index layer closest to the emission layer relative to any other low-refractive index layer is defined as the low-refractive index layer closest to the emission layer. In addition, when the number of low-refractive index layers provided between the emission layer and the reflective electrode is one, the low-refractive index layer is the low-refractive index layer closest to the emission layer.

By the way, the low-refractive index layer is a layer provided between the emission layer and the reflective electrode, and hence has two interfaces, i.e., an interface on an emission layer side and an interface on a reflective electrode side.

When the low-refractive index layer and a layer (the emission layer or the charge injection/transport layer) having a refractive index higher than that of the low-refractive index layer are brought into contact with each other, part of light output from the emission layer can be reflected at an interface between the low-refractive index layer and the layer (the emission layer or the charge injection/transport layer) adjacent to the low-refractive index layer by virtue of a refractive index difference between both the layers. In view of the foregoing, in the following description, two interfaces of the low-refractive index layer in contact with the layers (the emission layer and the charge injection/transport layer) each having a refractive index higher than that of the low-refractive index layer on the surface of the low-refractive index layer on the emission layer side and the surface thereof on the reflective electrode side are each sometimes referred to as "reflection interface".

In the present invention, an optical path $L_1$ between the maximum emission surface of the emission layer and the reflection surface of the reflective electrode satisfies the following expression (1). It is to be noted that the definition of the reflection surface of the reflective electrode is described later.

$$\left(4m - 1 - \frac{\phi}{90}\right) \times \left(\frac{\lambda}{8}\right) < L_1 < \left(4m + 1 - \frac{\phi}{90}\right) \times \left(\frac{\lambda}{8}\right) \quad (1)$$

In the expression (1), $\lambda$ represents the maximum peak wavelength of an emission spectrum, $\phi$ represents a phase shift [deg] on the reflection surface of the reflective electrode, and m represents a positive integer. Further, the optical path $L_1$ more preferably satisfies the following expression (1').

$$\left(8m - 1 - \frac{\phi}{45}\right) \times \left(\frac{\lambda}{16}\right) \leq L_1 \leq \left(8m + 1 - \frac{\phi}{45}\right) \times \left(\frac{\lambda}{16}\right) \quad (1')$$

In the present invention, the maximum emission surface of the emission layer means a region having the highest emission intensity out of the emission layer. Here, the maximum emission surface of the emission layer, which is ideally a surface region having a thickness of zero, is typically a three-dimensional region having some degree of thickness. The thickness as used herein can be neglected upon consideration of, for example, the optical interference condition of the expression (1). It is to be noted that the position of the maximum emission surface of the emission layer can be appropriately set depending on, for example, a charge balance in the emission layer.

In the present invention, the expression (1) (preferably the expression (1')) needs to be satisfied. Thus, the thickness of a layer between the reflective electrode and the light exiting side electrode can be set to a thickness sufficient for the suppression of the occurrence of a short circuit or an emission point.

Further, in the present invention, an optical path $L_2$ between the interface on the emission layer side of the low-refractive index layer closest to the emission layer and the maximum emission surface of the emission layer satisfies the following expression (2), and p in the expression (2) equals 0.

$$(4p-1) \times \frac{\lambda}{8} < L_2 < (4p+1) \times \frac{\lambda}{8} \qquad (2)$$

In the expression (2), $\lambda$ represents the maximum peak wavelength of the emission spectrum and p represents 0 or a positive integer. It is to be noted that for the low-refractive index layer provided between the reflective electrode and the emission layer in the present invention, p in the expression (2) represents 0 or a positive integer. In the present invention, p in the expression (2) is determined based on the number of low-refractive index layers provided between the reflective electrode and the emission layer, and their placement positions. Here, when the optical path $L_2$ is an optical path between the interface on the emission layer side of the low-refractive index layer closest to the emission layer and the maximum emission surface of the emission layer, p in the expression (2) equals 0. In other words, for the low-refractive index layer closest to the emission layer out of the low-refractive index layers, p equals 0. Accordingly, a requirement concerning the $L_2$ for the low-refractive index layer closest to the emission layer can be represented by the following expression (2').

$$0 \leq L_2 < \frac{\lambda}{8} \qquad (2')$$

By the way, substituting p=0 into a character expression "$(4p-1) \times (\lambda/8)$" in the expression (2) yields $-\lambda/8$. Here, $-\lambda/8$ becomes a negative value because $\lambda$ is a positive real number. However, a lower limit for the $L_2$ in the expression (2) becomes zero as represented by the expression (2') because the $L_2$ cannot take a negative value. Here, a state where the $L_2$ equals zero means that the maximum emission surface of the emission layer is positioned at an interface between the low-refractive index layer closest to the emission layer and the emission layer. In the present invention, the optical path $L_2$ preferably satisfies the following expression (2").

$$0 \leq L_2 \leq \frac{\lambda}{16} \qquad (2'')$$

It is to be noted that when two low-refractive index layers are provided, the expression (2) may also hold in the optical path ($L_2$) between the interface on an emission layer side of the low-refractive index layer, which differs from the low-refractive index layer closest to the emission layer, and the maximum emission surface of the emission layer. However, in such case, p in the expression (2) represents an integer of 1 or more (p≥1). In other words, the optical path $L_2$ itself means an optical path between the interface on the emission layer side of at least one low-refractive index layer, which is provided between the emission layer and the reflective electrode, and the maximum emission surface of the emission layer. Accordingly, the expression (2) itself is never a requirement imposed only on the low-refractive index layer closest to the emission layer.

In the present invention, the thickness of the low-refractive index layer is preferably more than $\frac{1}{8}\lambda$ and less than $\frac{3}{8}\lambda$ in terms of an optical path length.

The inventors of the present invention have made extensive analysis of the behavior of light in an organic EL element including a low-refractive index layer that is a layer having a refractive index lower than that of an emission layer. As a result, the inventors have found that the element has efficiency higher than the conventional one when the interference conditions of the expression (1) and the expression (2) are satisfied.

Hereinafter, an organic EL element according to an embodiment of the present invention is described with reference to the drawings. It is to be noted that a widely known technology or publicly known technology in the art is applicable to a portion that is neither particularly shown in the drawings nor particularly described in the following description. In addition, the embodiment to be described below is merely one embodiment of the present invention and the present invention is not limited to the embodiment.

First Embodiment

FIG. 1 is a schematic sectional view illustrating an organic EL element according to a first embodiment of the present invention. The organic EL element 1 of FIG. 1 is an electronic element obtained by laminating, on a substrate 10, a lower electrode 21, a first charge injection/transport layer 22, a second charge injection/transport layer 23, an emission layer 24, a third charge injection/transport layer 25, and an upper electrode 26 in the stated order. It is to be noted that in the organic EL element of the present invention, an optical adjustment layer 30 may be provided on the upper electrode 26 as illustrated in FIG. 1.

In the organic EL element 1 of FIG. 1, the lower electrode 21 functions as a reflective electrode. Accordingly, the organic EL element 1 of FIG. 1 is a top emission-type organic EL element in which light is extracted from a side opposite to the substrate 10. It should be appreciated that the present invention is not limited to the aspect, and a bottom emission type in which the upper electrode 26 is a reflective electrode and light is extracted from a substrate 10 side is also included in the present invention.

Hereinafter, constituent members for the organic EL element of FIG. 1 are described. It is to be noted that although the following description postulates that the lower electrode 21 and the upper electrode 26 are semi-transmissive metal films functioning as an anode and a cathode, respectively, the present invention is not limited to the aspect.

(1) Substrate

Examples of the substrate 10 include various glass substrates and silicon substrates. When the organic EL element of the present invention is utilized as a constituent member for an organic EL display apparatus, a substrate having a drive circuit (not shown) such as a thin-film transistor (TFT), which is formed of a semiconductor such as poly-Si or amorphous silicon (a-Si), formed on a base material is used in some cases.

(2) Lower Electrode (Reflective Electrode)

The lower electrode 21 as a reflective electrode is an electrode layer mainly having a metal reflective film for the purpose of improving the emission efficiency of the organic EL element. A metal material constituting the metal reflective film is preferably a metal material having a high reflectance. Specific examples of the metal material having a high reflectance include metals such as Al and Ag, and alloys thereof each having a reflectance for visible light of 85% or more. In addition, the lower electrode 21 may be one metal reflective film alone, or may be a laminate of the metal reflective film and a material having a large work function that also serves as a barrier layer for barriering the metal reflective film. In this case, a constituent material for the barrier layer is specifically, for example, a transparent conductive layer made of an indium tin oxide, an indium zinc oxide, or the like, a metal material such as Ti, Mo, or W, or a metal oxide such as $MoO_3$.

When the reflective electrode is constituted only of the metal reflective film, the reflection surface of the reflective electrode is an interface between the metal reflective film and an organic compound layer to be described later. On the other hand, when the reflective electrode is constituted of the metal reflective film and the barrier layer, the reflection surface of the reflective electrode is an interface between the metal reflective film and the barrier layer. In other words, the reflection surface of the reflective electrode can be defined as the interface of the metal reflective film on an emission layer side.

(3) Charge Injection/Transport Layer

The charge injection/transport layers (22, 23, and 25) provided between the electrodes (the lower electrode 21 and the upper electrode 26) and the emission layer 24 are classified into two kinds, i.e., a hole injection/transport layer and an electron injection/transport layer depending on the characteristics of charges discharged from the electrodes to the emission layer. Here, the hole injection/transport layer is a concept comprehending a hole injection layer, a hole transport layer, an electron-blocking layer, and the like, and it should be appreciated that a laminate obtained by laminating multiple hole injection layers, multiple hole transport layers, or multiple electron-blocking layers is also included in the concept. In addition, the electron injection/transport layer is a concept comprehending an electron injection layer, an electron transport layer, a hole-blocking layer, and the like, and it should be appreciated that a laminate obtained by laminating multiple electron injection layers, multiple electron transport layers, or multiple hole-blocking layers is also included in the concept.

When the lower electrode 21 and upper electrode 26 in the organic EL element 1 of FIG. 1 are an anode and a cathode, respectively, the first charge injection/transport layer 22 and second charge injection/transparent layer 23 provided between the lower electrode 21 and the emission layer 24 are each a hole injection/transport layer. On the other hand, the third charge injection/transport layer 25 provided between the emission layer 24 and the upper electrode 26 is an electron injection/transport layer.

It is to be noted that the second charge injection/transport layer 23 (hole injection/transport layer) in the organic EL element 1 of FIG. 1 has a refractive index lower than that of the adjacent layers (the first charge injection/transport layer 22 and the emission layer 24) and hence functions as a low-refractive index layer. As described above, the second charge injection/transport layer 23 functions as a low-refractive index layer and hence the first charge injection/transport layer 22 functions as a charge injection/transport layer having a refractive index higher than that of the low-refractive index layer. It is to be noted that a function of the low-refractive index layer is described later.

In the present invention, the number of charge injection/transport layers constituting the organic EL element and a material in each charge injection/transport layer are not particularly limited, and a publicly known charge injection material or charge transport material can be used.

(4) Emission Layer

In the organic EL element 1 of FIG. 1, a light-emitting material as a constituent material for the emission layer 24 may be a fluorescent material or may be a phosphorescent material. In addition, the luminescent color of the emission layer 24 is not particularly limited, and examples thereof include a red color, a green color, and a blue color.

It is to be noted that the refractive index of the emission layer 24 depends on the luminescent color of the emission layer 24, i.e., the wavelength bandwidth of light output from the emission layer 24. For example, when the wavelength bandwidth of the light output from the emission layer 24 is around 460 nm as a blue wavelength bandwidth, the refractive index of the emission layer 24 is about 1.8 to 1.9. On the other hand, when the wavelength bandwidth of the light output from the emission layer 24 is around 600 nm as a red wavelength bandwidth, the refractive index of the emission layer 24 is about 1.7 to 1.8.

(5) Upper Electrode

The upper electrode 26 as a light exiting side electrode functions as a light transmissive electrode. Here, the light transmissive electrode is specifically, for example, a transparent conductive layer formed of a transparent conductive material or a semi-transmissive metal film obtained by forming a metal material into a film having a predetermined thickness.

When the upper electrode 26 is a transparent conductive layer, a constituent material for the upper electrode 26 is, for example, a transparent electrode material such as an indium zinc oxide or an indium tin oxide. On the other hand, when the upper electrode 26 is a semi-transmissive metal film, examples of the constituent material for the upper electrode 26 include a metal material such as Ag or Mg, and an alloy obtained by combining two kinds of metal materials. In addition, when the upper electrode 26 is a semi-transmissive metal film, the thickness of the upper electrode 26 is preferably 10 nm or more and 40 nm or less from the viewpoints of its film characteristics and light transmission property.

In addition, an electron injection layer containing an alkali metal is preferably provided between the third charge injection/transport layer 25 (electron injection/transport layer) and the upper electrode 26 from the viewpoint of electron injection property, or an alkali metal is preferably added into the upper electrode 26.

(6) Optical Adjustment Layer

The optical adjustment layer 30 provided on the upper electrode 26 is provided for the purpose of protecting the upper electrode 26. It is to be noted that when the thickness of the optical adjustment layer 30 corresponds to 650 nm or less as the wavelength range of visible light, the optical adjustment layer 30 becomes a member that may be involved in optical interference, and hence the layer affects a reflectance in a direction from the emission layer 24 to the upper electrode 26. The optical adjustment layer 30, which is preferably formed of a material having a high refractive index from the viewpoint of the adjustment of the reflectance, may be formed of an organic material or may be formed of an inorganic material as long as a requirement for the refractive index is satisfied.

(7) Intervening Layer

In the organic EL element 1 of FIG. 1, an intervening layer may be provided between the emission layer 24 and the second charge injection/transport layer 23 (low-refractive index layer). In this case, the layer is desirably provided after its thickness has been adjusted to satisfy an optical interference condition to be described later. The refractive index of the intervening layer is equal to or more than the refractive index of the emission layer.

(8) Optical Interference

Next, an optical interference condition required of the organic EL element of FIG. 1 is described. It is to be noted that the optical interference condition required in the present invention is an optical interference condition resulting from a member formed between the emission layer 24 and the lower electrode 21.

As an optical interference condition in a direction from the emission layer 24 to the lower electrode 21, it is important that reflected light in the lower electrode 21 and light traveling from the emission layer 24 to the upper electrode 26 without via the lower electrode 21 be in phase with each other at a desired wavelength. The intensity in a front direction of light having a wavelength λ which one wishes to extract can be strengthened when the optical path $L_1$ from a maximum emission surface 24a of the emission layer 24 to the surface (reflective metal film surface) of the lower electrode 21 satisfies the following expression (I).

$$L_1 = \left(2m - \frac{\phi}{180}\right) \times \left(\frac{\lambda}{4}\right) \quad (I)$$

In the expression (I), ϕ represents a phase shift [deg] at the time of reflection and its sign is negative in a phase delay direction.

In the expression (I), m represents 0 or a positive integer. In addition, m represents a constant called the order of interference. Here, in the case of m=0, the optical path $L_1$ takes the positive minimum (−λϕ/720) satisfying the expression (I). However, a distance between the emission layer 24 and the lower electrode 21 in the case of m=0 shortens as compared to that in the case where m represents a positive integer. In that case, a non-emission point resulting from a short circuit caused by a minute foreign substance matters. Accordingly, m in the expression (I) preferably represents a positive integer.

ϕ (phase shift) in the expression (I), which varies depending on a metal species and the refractive index of a layer positioned on the surface of the metal species, is generally about −100° to −160°.

Figure 2:
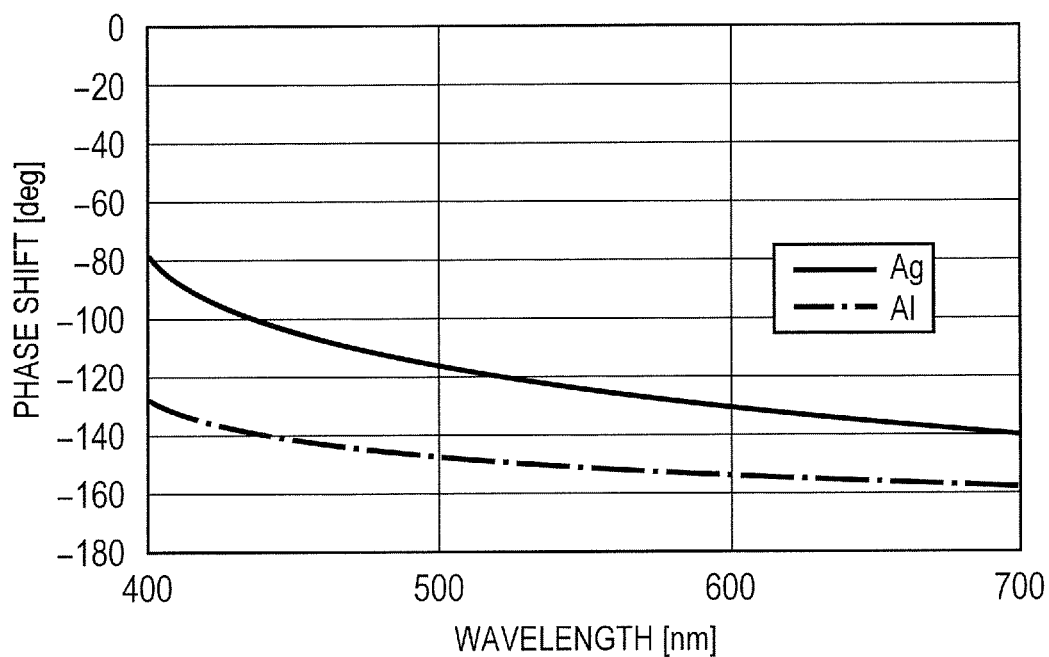
FIG. 2 is a view illustrating a phase shift when light entering a reflective electrode from an organic compound layer is reflected on the reflective electrode.

FIG. 2 is a graph showing a phase shift when light entering a reflective electrode from an organic compound layer is reflected on the reflective electrode. It is to be noted that FIG. 2 is also a graph showing the dependence of a phase shift on the wavelength of the light entering the reflective electrode. In addition, FIG. 2 is a graph showing a phase shift when light entering an Ag film or an Al film from a general organic compound layer (λ=460 nm, n=1.85) is reflected.

By the way, the optical path $L_1$ in the expression (I) is determined by summing the product of the refractive index (n) and thickness (d) of each layer provided between the maximum emission surface 24a of the emission layer 24 and the reflection surface of the reflective electrode. It is to be noted that a phase shift [deg] and reflectance when a thin film is laminated can be determined by general calculation for an optical multilayer thin film.

In an actual organic EL element, however, in consideration of, for example, view angle characteristics in a trade-off relationship with light emission efficiency from a front surface, the optical path does not necessarily need to be caused to strictly coincide with a thickness determined from the optical path $L_1$ determined through calculation with the expression (I) (the thickness value determined through calculation). Specifically, the optical path may have an error of up to ±λ/8 from the optical path $L_1$ determined from the expression (I). Accordingly, the optical path $L_1$ in the organic EL element of the present invention is required to satisfy the following expression (1).

$$\left(4m - 1 - \frac{\phi}{90}\right) \times \left(\frac{\lambda}{8}\right) < L_1 < \left(4m + 1 - \frac{\phi}{90}\right) \times \left(\frac{\lambda}{8}\right) \quad (1)$$

It is to be noted that when a value for m in the expression (1) increases, a reduction in emission efficiency due to the narrowing of the bandwidth of a spectrum becomes remarkable. Therefore, m preferably represents 1. Further, in the present invention, an error from the optical path $L_1$ (thickness value determined through calculation) determined from the expression (I) is preferably up to ±λ/16. In other words, in the present invention, the optical path $L_1$ preferably satisfies the following expression (1').

$$\left(8m - 1 - \frac{\phi}{45}\right) \times \left(\frac{\lambda}{16}\right) \leq L_1 \leq \left(8m + 1 - \frac{\phi}{45}\right) \times \left(\frac{\lambda}{16}\right) \quad (1')$$

In the present invention, at least one low-refractive index layer having a refractive index at the maximum peak wavelength of the emission spectrum of light output from the emission layer 24 lower than that of the emission layer 24 by 0.1 or more is placed between the emission layer 24 and the lower electrode 21 (reflective electrode). In particular, when a low-refractive index layer having a refractive index lower than that of an adjacent layer by 0.1 or more is placed so as to be adjacent to the emission layer 24 or in the vicinity of the emission layer 24, and an optical path between the interface (reflection interface) of the low-refractive index layer and the maximum emission surface is properly set, an organic EL element having efficiency higher than the conventional one is obtained. In the organic EL element 1 of FIG. 1, the second charge injection/transport layer 23 is a layer (low-refractive index layer) having a refractive index lower than that of the emission layer 24 by 0.1 or more and the first charge injection/transport layer 22 is a layer having a refractive index higher than that of the second charge injection/transport layer 23 by 0.1 or more. Thus, a refractive index difference arises at each of an interface between the first charge injection/transport layer 22 and the second charge injection/transport layer 23, and an interface between the second charge injection/transport layer 23 and the emission layer 24. Accordingly, a reflection interface is formed at each of both interfaces. The thicknesses of both the first charge injection/transport layer 22 and the second charge injection/transport layer 23 satisfying the requirements of the expression (2) and the expression (3), respectively are appropriately set based on the foregoing.

Here, an optical interference condition in this embodiment is discussed below by taking, as a specific example, an organic EL element in which two hole injection/transport layers (an HTL1 on a reflective electrode side and an HTL2 on an emission layer side) are provided between an anode as a reflective electrode and an emission layer. It is to be noted that the HTL1 corresponds to the first charge injection/transport layer 22 of FIG. 1 and the HTL2 corresponds to the second charge injection/transport layer 23 of FIG. 1. The following description is also applicable to an organic EL element in which two electron injection/transport layers are provided between a cathode as a reflective electrode and an emission layer. In addition, in the following description, the discussion is performed based on conditions described below.

Value for m in the expression (1): 1
Lower electrode 21: A reflective electrode formed of an Ag film
Maximum peak wavelength (λ) of an emission spectrum: 460 nm (blue emission)

Described first is the case where the refractive index of the HTL1 is comparable to that of the emission layer and the refractive index of the HTL2 is lower than that of the emission layer by 0.1 or more. In this case, a refractive index difference of 0.1 or more arises at each of the two interfaces of the HTL2 (the interface on the emission layer side and the interface on the HTL1 side), and hence part of light output from the emission layer may be reflected at one of the two interfaces of the HTL2. Accordingly, each of the two interfaces of the HTL2 can be viewed as a reflection interface.

Here, a phase shift when light entering a layer having a low refractive index from a layer having a high refractive index is reflected at a reflection interface is 0. Therefore, a phase matching condition in the optical path $L_2$ between a reflection interface directed from the layer having a high refractive index to the layer having a low refractive index when viewed from the maximum emission surface of the emission layer, specifically, the interface of the HTL2 on the emission layer side and the maximum emission surface of the emission layer is as represented by the following expression (II).

$$L_2 = (\lambda/2) \times p \quad \text{(II)} \ (p=0, 1, 2, \ldots)$$

It is to be noted that the optical path $L_2$ is allowed to have an error of about ±λ/8 from a theoretical value (thickness value determined from the expression (II) through calculation) as in the $L_1$. Therefore, the optical path $L_2$ is required to satisfy the following expression (2).

$$(4p-1) \times \frac{\lambda}{8} < L_2 < (4p+1) \times \frac{\lambda}{8} \quad (2)$$

In the present invention, the error from the optical path $L_2$ (thickness value determined through calculation) determined from the expression (II) is preferably up to ±λ/16. In other words, the optical path $L_2$ preferably satisfies the following expression (2a).

$$(8p-1) \times \frac{\lambda}{16} \leq L_2 \leq (8p+1) \times \frac{\lambda}{16} \quad (2a)$$

Here, in the low-refractive index layer closest to the emission layer, the optical path $L_2$ between the interface of the low-refractive index layer on the emission layer side and the maximum emission surface of the emission layer satisfies the expression (2) (preferably the expression (2a)) and a relationship of p=0 is satisfied. However, substituting p=0 into a character expression "(4p−1)×(λ/8)" in the expression (2) yields −λ/8. Here, −λ/8 becomes a negative value because λ is a positive real number. However, a lower limit for the $L_2$ in the expression (2) becomes zero because the $L_2$ cannot take a negative value. In addition, substituting p=0 into a character expression "(8p−1)×(λ/16)" in the expression (2a) yields −λ/16 but a lower limit for the $L_2$ in the expression (2a) also becomes zero because the $L_2$ cannot take a negative value. In other words, in the case of p=0, the expression (2) is substantially the expression (2') and the expression (2a) is substantially the expression (2").

$$0 \leq L_2 < \frac{\lambda}{8} \quad (2')$$

$$0 \leq L_2 \leq \frac{\lambda}{16} \quad (2'')$$

Meanwhile, a phase shift when light entering a layer having a high refractive index from a layer having a low refractive index is reflected at a reflection interface is 180°. Therefore, a suitable phase matching condition in an optical path $L_3$ between a reflection interface directed from the layer having a low refractive index to the layer having a high refractive index when viewed from the maximum emission surface of the emission layer, specifically, the interface of the HTL2 on the HTL1 side (reflective electrode side) and the maximum emission surface is as represented by the following expression (III).

$$L_3 = (\lambda/4) \times (2q+1) \quad \text{(III)} \ (q=0, 1, 2, \ldots)$$

It is to be noted that the optical path $L_3$ is allowed to have an error of about ±λ/8 as in the $L_1$ and the $L_2$. Therefore, the optical path $L_3$ preferably satisfies the following expression (3).

$$(4q+1) \times \frac{\lambda}{8} < L_3 < (4q+3) \times \frac{\lambda}{8} \quad (3)$$

Further, in the present invention, the error range is preferably up to ±λ/16 from the thickness value determined by using the optical path $L_3$ from the expression (III) through calculation. In other words, the optical path $L_3$ preferably satisfies the following numerical expression (3').

$$(8q+3) \times \frac{\lambda}{16} \leq L_3 \leq (8q+5) \times \frac{\lambda}{16} \quad (3')$$

In this embodiment, it is preferred that the optical path $L_3$ between the interface between the charge injection/transport layer (HTL1) and the low-refractive index layer (HTL2) closest to the emission layer, and the maximum emission surface of the emission layer satisfy the following expression (3), and a relationship of q=0 be satisfied for an improvement in emission efficiency. It is to be noted that in the present invention, the low-refractive index layer to be utilized upon determination of the optical path $L_2$ from the expression (2) and the low-refractive index layer to be utilized upon determination of the optical path $L_3$ from the expression (3) may be identical to or different from each other.

Here, suppose that an emission region in the emission layer localizes toward the hole injection/transport layer (HTL2) and the maximum emission surface of the emission layer is positioned at 2 nm from the interface of the emission layer on the reflective electrode side. An optimum value for the optical path from the maximum emission surface of the emission layer to the reflection interface of the HTL2 (the reflection interface on the emission layer side or the reflection interface on the HTL1 side) is discussed based on those conditions.

Here, as is understood from the expression (2), the allowable range of the optical path $L_2$ from the maximum emission surface of the emission layer to the reflection interface of the HTL2 on the emission layer side is as shown in Table 1 below. Similarly, as is understood from the expression (3), the allowable range of the optical path $L_3$ from the maximum emission surface of the emission layer to the reflection interface of the HTL2 on the HTL1 side is as shown in Table 2 below.

TABLE 1

| | $L_2$ | |
|---|---|---|
| λ | 460 | 460 |
| p | 0 | 1 |
| Minimum [nm] | (−57.5) | 172.5 |
| Maximum [nm] | 57.5 | 287.5 |

TABLE 2

| | $L_3$ | |
|---|---|---|
| λ | 460 | 460 |
| p | 0 | 1 |
| Minimum [nm] | 57.5 | 287.5 |
| Maximum [nm] | 172.5 | 402.5 |

It is to be noted that the mathematical minimum for the $L_2$ in the case of p=0 is −57.5 nm but the substantial minimum for the $L_2$ in the case of p=0 is 0 nm because the optical path does not take a negative value.

Figure 3:
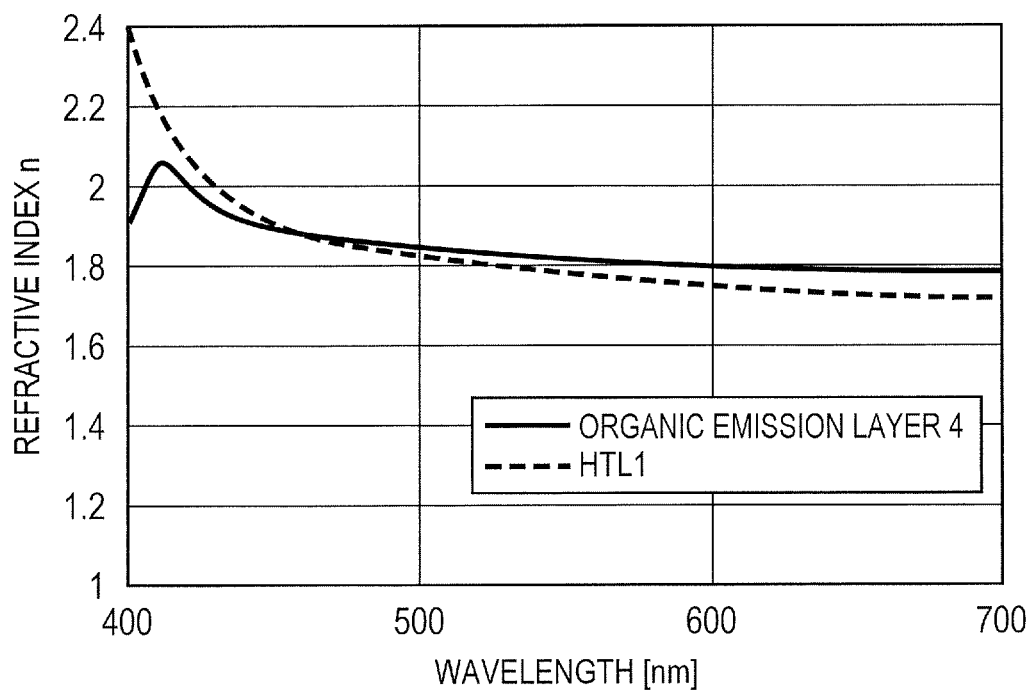
FIG. 3 is a view illustrating the wavelength dependence of the refractive index of each of an emission layer and an HTL1.

Described below is the result of the analysis of a relationship between: the thickness of the HTL1 and the thickness of the HTL2 (low-refractive index layer); and emission efficiency. FIG. 3 is a graph showing the wavelength dependence of the refractive index of each of the emission layer and the HTL1. As shown in FIG. 3, the refractive index of each of the emission layer and the HTL1 at a wavelength of 460 nm is about 1.85. It is to be noted that in the following simulation, the optimization of the optical path $L_1$ is performed in the case where m in the expression (1) represents 1 unless otherwise stated. In addition, the emission region in the emission layer is assumed to localize toward the hole injection/transport layer (HTL2) and the maximum emission surface in the emission layer is assumed to be positioned at 2 nm from the interface of the emission layer on the hole injection/transport layer (HTL2) side. In addition, the simulation was performed by the same approach as that of Non Patent Literature 1, and with regard to internal quantum efficiency, exciton production efficiency was set to 25% and an emission yield was set to 80%.

Figure 4:
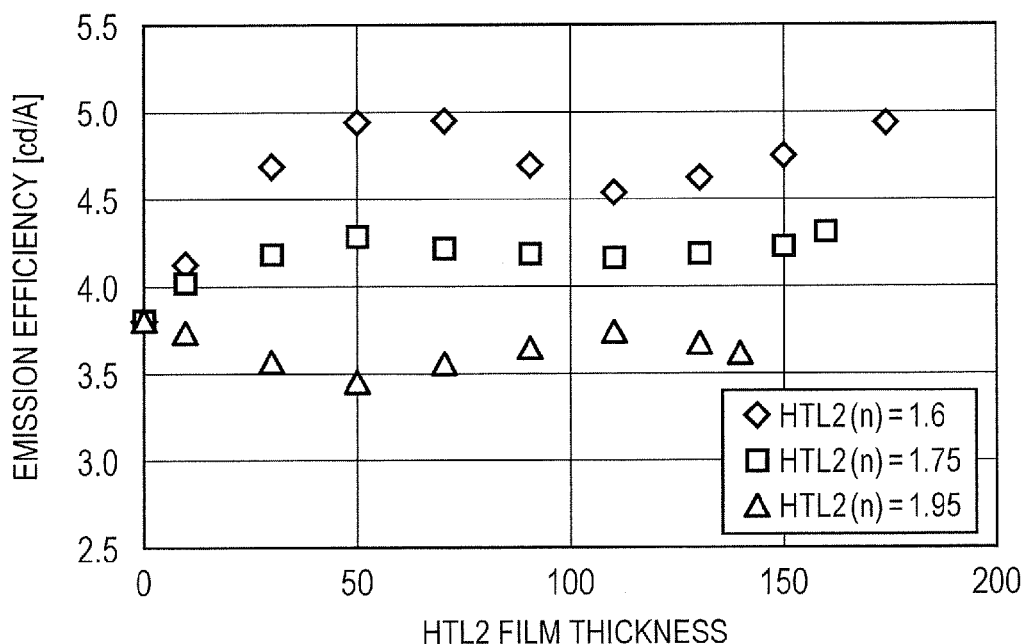
FIG. 4 is a graph showing a relationship between: the refractive index and thickness of an HTL2; and emission efficiency.

FIG. 4 is a graph showing a relationship between: the refractive index and thickness of the HTL2; and the emission efficiency. It is to be noted that the graph of FIG. 4 was determined by a simulation. In addition, the case where a value indicated by the axis of abscissa in the graph of FIG. 4 is 0 states that the thickness of the HTL2 is 0 nm, which means that the HTL2 is absent as a constituent member for the organic EL element. That is, the case where the value indicated by the axis of abscissa is 0 represents an aspect in which only the HTL1 is provided between the reflective electrode (anode) and the emission layer.

Here, the refractive index of the HTL2 at λ=460 nm is set to 1.6, 1.75, or 1.95. Here, out of the three kinds of refractive indices each set as the refractive index of the HTL2, the refractive indices of 1.6 and 1.75 apply to the definition of the low-refractive index layer as used in the present invention. Here, an effect occurring when the refractive index of the HTL2 is set to 1.6 is described.

In the simulation, the optical path $L_2$ from the maximum emission surface of the emission layer to the interface between the emission layer and the HTL2 (the interface of the HTL2 on the emission layer side) is determined to be $(L_2=)2\times1.85\approx3.7$ nm. The value is always constant irrespective of the state of the HTL2. In addition, as is understood from Table 1, the resultant $L_2$ satisfies the condition of the expression (2) in the case of p=0.

On the other hand, as can be seen from Table 2, the optical path $L_3$ from the maximum emission surface of the emission layer to the reflection interface of the HTL2 on the HTL1 side is (suitably) 57.5 nm or more and 172.5 nm or less in the case of q=0. A range in terms of the thickness of the HTL2 obtained by dividing the numerical range by the refractive index (1.6) of the HTL2 is from 33.6 nm or more to 105.5 nm or less. Meanwhile, as shown in FIG. 4, when the refractive index of the HTL2 is 1.6, the emission efficiency takes a local maximum when its thickness is in the vicinity of 60 nm. In addition, even in the range of from 33.6 nm or more to 105.5 nm or less, the efficiency is found to be higher than that in the case where the HTL2 is absent (the case where the thickness of the HTL2 is 0).

Similarly, as shown in FIG. 4, the range of the thickness of the HTL2 satisfying the condition of the expression (3) in the case of q=1 is from 177 nm or more to 249 nm or less. In actuality, as can be seen from FIG. 4, when the thickness of the HTL2 takes a value larger than 105.5 nm, the emission efficiency improves according to the thickness of the HTL2. Then, the emission efficiency takes a second local maximum when the thickness of the HTL2 is 177 nm or more. However, the optical path from the maximum emission surface of the emission layer to the reflective electrode is specified by the expression (1), and hence there is an upper limit for the sum of the thicknesses of the two kinds of hole transport layers (the HTL1 and the HTL2) positioned between the emission layer and the reflective electrode. In addition, when the thickness of the HTL1 is 0 nm, the only reflection interface that differs in refractive index from an adjacent layer by 0.1 or more in the two interfaces of the low-refractive index layer (HTL2) is the reflection interface on the emission layer side. In this case, the emission efficiency improves as compared to that of a conventional organic EL element because the interference of light at the reflection interface of the HTL2 on the emission layer side can be utilized.

By the way, when the refractive index of the HTL2 is set to 1.75, the refractive index of the HTL2 is in the following state: the refractive index is lower than that of each of the emission layer and the HTL1 by 0.1. In this case, the optical path $L_3$ from the maximum emission surface of the emission layer to the reflection interface of the HTL2 on the HTL1 side is 57.5 nm or more and 172.5 nm or less under the condition of q=0. A range in terms of the thickness of the HTL2 obtained by dividing the numerical range by the refractive index (1.75) of the HTL2 is from 30.8 nm or more to 96.4 nm or less. Meanwhile, as shown in FIG. 4, the emission efficiency takes a local maximum when the thickness of the HTL2 is in the vicinity of 50 nm. In addition, even in the range of from 30.8 nm or more to 96.4 nm or less, the efficiency is found to be higher than that in the case where the HTL2 is absent (the case where the thickness of the HTL2 is 0 nm).

For reference purposes, the case where the refractive index of the HTL2 is 1.95 is described below. As can be seen from FIG. 4, when the refractive index of the HTL2 is 1.95, the emission efficiency is lower than that in the case where the HTL2 is absent (the case where the thickness of the HTL2 is 0 nm) no matter how the thickness of the HTL2 is set. The foregoing results from a reduction in emission efficiency due to the fact that the reflection interface of the HTL2 needed for defining the optical path $L_3$ is not set at a proper position. When the refractive index of the HTL2 is higher than that of the emission layer, the interface needed for defining the optical path $L_3$ out of the two interfaces of the HTL2 is the interface of the HTL2 on the emission layer side. This is because the interface needed for defining the optical path $L_3$ is based on an interface (reflection interface) when light traveling from the emission layer to the reflective electrode travels from a low-refractive index medium to a high-refractive index medium.

In that case, the optical path $L_3$, i.e., the optical path from the interface between the emission layer and the HTL2 to the maximum emission surface of the emission layer is 3.7 nm, which does not satisfy the requirement of the expression (3) even in the case of q=0. Therefore, it is found that the emission efficiency does not improve when the refractive index of the HTL2 placed in the vicinity of the emission layer is higher than that of the emission layer.

Next, a relationship between the refractive index of the HTL1 and emission efficiency in an organic EL element in which two hole injection/transport layers (the HTL1 on the reflective electrode side and the HTL2 on the emission layer side) are provided between an anode as the reflective electrode and the emission layer is discussed in order that the effect of the present invention may be verified. It is to be noted that during the discussion, the refractive index of each of the HTL2 and the emission layer at λ=460 nm is assumed to be 1.85.

Figure 5:
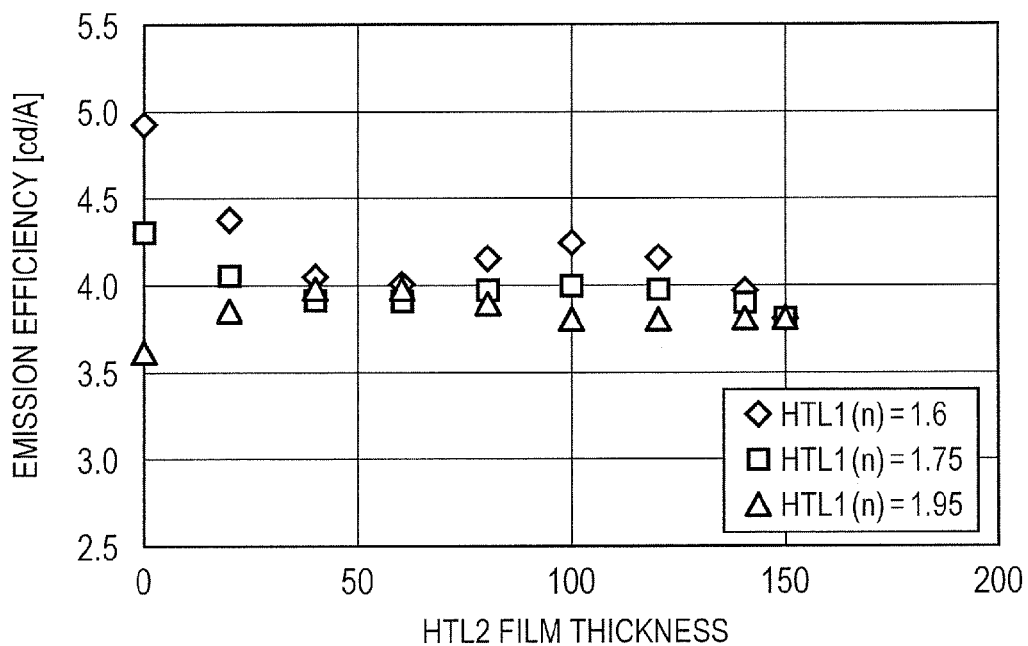
FIG. 5 is a graph showing a relationship between: the refractive index of the HTL1 and the thickness of the HTL2; and the emission efficiency.

FIG. 5 is a graph showing a relationship between: the refractive index of the HTL1 and the thickness of the HTL2; and the emission efficiency. It is to be noted that the graph of FIG. 5 was determined by a simulation. In addition, the case where a value indicated by the axis of abscissa in the graph of FIG. 5 is 0 states that the thickness of the HTL2 is 0 nm, which means that the HTL2 is absent as a constituent member for the organic EL element. That is, the case where the value indicated by the axis of abscissa is 0 represents an aspect in which only the HTL1 is provided between the reflective electrode (anode) and the emission layer.

Here, the relationship between the thickness of the HTL2 and the emission efficiency when the refractive index of the HTL1 is set to 1.6, 1.75, or 1.95 is described.

As shown in FIG. 5, when the refractive index of the HTL1 is 1.6, the case where the requirement of the expression (2) is satisfied for p=0 is the case where the optical path between the maximum emission surface of the emission layer and the interface of the HTL2 on the reflective electrode side is 57.5 nm or less. A value obtained by converting the distance into a thickness is (57.5−1.85×2)/1.85≈29 nm (or less). In actuality, as illustrated in FIG. 5, when the refractive index of the HTL1 is 1.6, setting the thickness of the HTL2 to 29 nm or less provides good emission efficiency. Meanwhile, as is understood from FIG. 5, the fact that the emission efficiency takes a local maximum when the thickness of the HTL2 is in the vicinity of 100 nm is relevant to the fact that the optical path $L_2$ between the maximum emission surface of the emission layer and the reflection interface of the HTL2 on the HTL1 side satisfies the requirement of the expression (2) in the case of p=1. However, when the thickness of the HTL2 is in the vicinity of 100 nm, the requirement of the expression (2) is not satisfied in the case of p=0. Accordingly, an improving effect on the emission efficiency as high as that in the case where the thickness of the HTL2 is in the vicinity of 0 nm does not appear.

The fact that setting the thickness of the HTL2 to the vicinity of 0 nm provides efficiency higher than that provided by setting the thickness of the HTL2 to 100 nm represents the importance of the reflection interface of the HTL2 on the emission layer side in the case of p=0. In addition, the graph shown in FIG. 5 also shows that the emission efficiency is improved by bringing the low-refractive index layer (HTL1) and the emission layer close to each other. This is because of the following reason: a phase shift at wide angles enlarges and hence energy from excitons to be distributed in a vertical direction becomes relatively large. In the case where the refractive index of the HTL1 is 1.75 as well, the efficiency becomes highest when the thickness of the HTL2 is in the vicinity of 0 nm.

On the other hand, in the case where the refractive index of the HTL1 is set to 1.95 that is higher than that of the emission layer by 0.1, the emission efficiency becomes maximum when the thickness of the HTL2 is in the vicinity of 50 nm. This is because of the following reason: when the thickness of the HTL2 is set to 50 nm, the optical path $L_3$ between the reflection interface of the HTL2 on the HTL1 side, which corresponds to a reflection interface directed from the low-refractive index layer to the high-refractive index layer, and the maximum emission surface of the emission layer satisfies the requirement of the expression (3) in the case of q=1. However, comparison to the case where the refractive index of the HTL1 is 1.6 or 1.75 and the thickness of the HTL2 is in the vicinity of 0 nm shows that the emission efficiency is low when the refractive index of the HTL1 is higher than that of the emission layer.

In the present invention, multiple methods are available for imparting a refractive index difference to multiple charge injection/transport layers like the charge injection/transport layers (22 and 23) that constitute the organic EL element 1 of FIG. 1, and that are provided between the reflective electrode (lower electrode 21) and the emission layer 24. For example, the following method is available: materials different from each other in refractive index are formed into films to form the respective charge injection/transport layers. Here, a hole transport material (HTL) having a low refractive index is, for example, Compound 2 shown below.

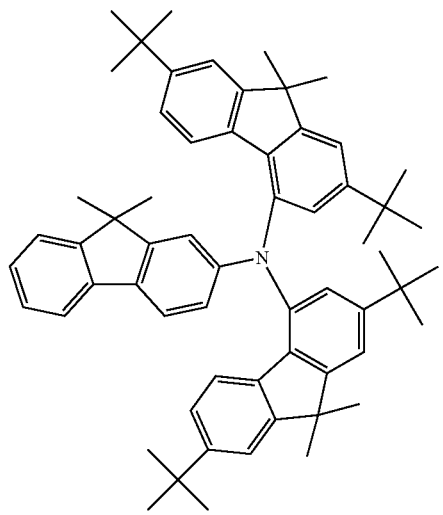

Compound 2

Compound 2 is a compound in which a tert-butyl group as a bulky functional group is introduced to a terminal of a triarylamine-based skeleton having hole transport property. When a bulky tert-butyl group is introduced, the film density of a formed film reduces and hence the refractive index of the film itself can be reduced. In addition, the refractive index-reducing effect can be expected from, for example, the introduction of a long-chain alkyl group to the terminal or the introduction of a functional group containing fluorine thereto. It is to be noted that the method is applicable even when a charge injection/transport layer provided between the reflective electrode (the lower electrode 21) and the emission layer 24 is an electron injection/transport layer.

Alternatively, a method involving doping a charge injectable/transportable material such as a hole transportable material with a low-refractive index material is available. When the method is employed, the low-refractive index material may be an organic material or may be an inorganic material. A film obtained by mixing, into Compound 1 (hole transportable material) shown below, Compound 2 or lithium fluoride as the low-refractive index material is described as an example.

Compound 1

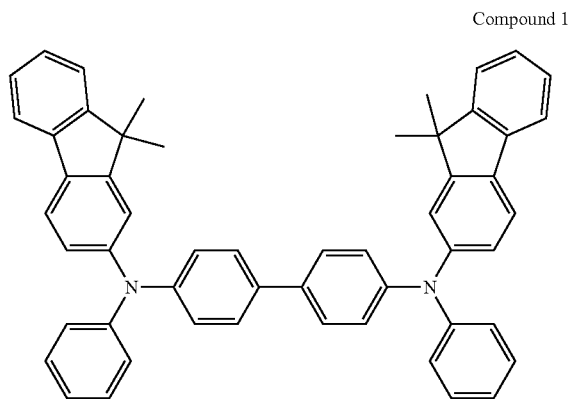 [SMILES: CC1(C)c2ccccc2-c2ccc(N(c3ccccc3)c3ccc(-c4ccc(N(c5ccccc5)c5ccc6c(c5)C(C)(C)c5ccccc5-6)cc4)cc3)cc21]

The refractive index of Compound 1 at a wavelength of 460 nm is 1.90. However, the refractive index is quantitatively changed (reduced) by doping with the low-refractive index material (Compound 2 or LiF) as shown in Table 3 and Table 4.

TABLE 3

| Compound 1 (mass %) | Compound 2 (mass %) | Refractive index |
|---|---|---|
| 100 | 0 | 1.90 |
| 80 | 20 | 1.85 |
| 60 | 40 | 1.80 |
| 40 | 60 | 1.75 |
| 20 | 80 | 1.70 |
| 0 | 100 | 1.65 |

TABLE 4

| Compound 1 (mass %) | LiF (mass %) | Refractive index |
|---|---|---|
| 100 | 0 | 1.90 |
| 80 | 20 | 1.81 |
| 60 | 40 | 1.72 |
| 40 | 60 | 1.62 |
| 20 | 80 | 1.51 |
| 0 | 100 | 1.40 |

As described above, the method involving doping the charge injectable/transportable material with the low-refractive index material can quantitatively change the refractive index, and hence the refractive index of the charge injection/transport layer can be quantitatively reduced. It is to be noted that the method for the doping with the low-refractive index material can be appropriately selected depending on a method of forming a layer of interest. Specifically, when the layer is formed by a dry film-forming method such as a vapor deposition method, the formation can be performed by an ordinary codeposition method. On the other hand, when the layer is formed by a wet film-forming method such as an application method, a solution obtained by mixing a constituent material for the layer at a predetermined ratio with a solvent has only to be formed into a film by the application method or the like.

By the way, the charge injection/transport layer serving as the low-refractive index layer may be formed by using a fluorine-based polymer such as polytetrafluoroethylene. The layer formed of the fluorine-based polymer is formed by the wet film-forming method such as the application method and a low-refractive index film having a refractive index around 1.30 can be formed from the polymer. It is to be noted that a substantial lower limit for the refractive index of the low-refractive index layer may be about 1.3 because there may be no solid material having a refractive index lower than that of the fluorine-based polymer. It is to be noted that in the present invention, an upper limit for the refractive index of the low-refractive index layer is a value lower than the refractive index of the emission layer by 0.1. In addition, the thickness of the low-refractive index layer is an odd number multiple of $\frac{1}{4}\lambda$ in terms of an optical path length in order that both target values for the expression (2) and the expression (3) may be satisfied at both interfaces of the low-refractive index layer. However, the charge mobility of the low-refractive index layer is generally low and hence a target value for the thickness of the low-refractive index layer is most preferably $\frac{1}{4}\lambda$ that is thinnest in terms of an optical path length. It is to be noted that the target value is allowed to have an error of about $\pm\frac{1}{8}\lambda$. Accordingly, the thickness of the low-refractive index layer is preferably more than $\frac{1}{8}\lambda$ and less than $\frac{3}{8}\lambda$ in terms of an optical path length. The thickness of the low-refractive index layer is more preferably $\frac{3}{16}\lambda$ or more and $\frac{5}{16}\lambda$ or less in terms of an optical path length.

Second Embodiment

Figure 6:
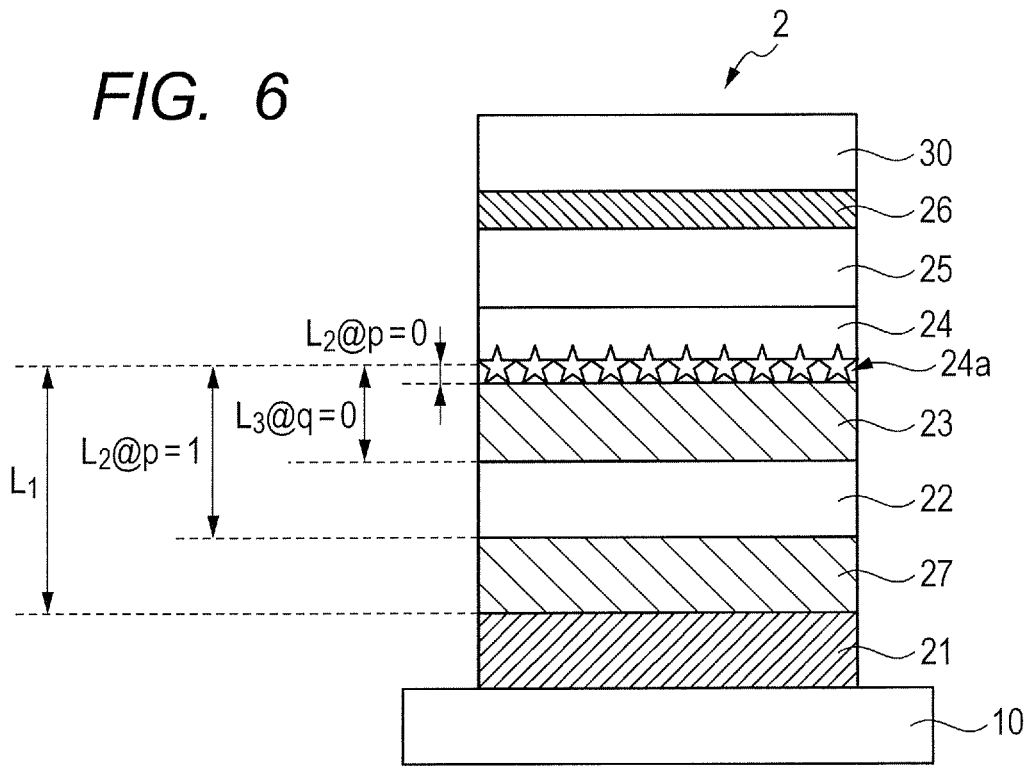
FIG. 6 is a schematic sectional view illustrating a second embodiment in the organic EL element of the present invention.

FIG. 6 is a schematic sectional view illustrating a second embodiment in the organic EL element of the present invention. An organic EL element 2 of FIG. 6 is of the same construction as that of the organic EL element 1 of FIG. 1 with the exception that a fourth charge injection/transport layer 27 is further provided between the lower electrode 21 and the first charge injection/transport layer in the organic EL element 1 of FIG. 1.

In the organic EL element 2 of FIG. 6, the fourth charge injection/transport layer 27 is a hole injection/transport layer because the layer is provided between the lower electrode 21, which serves as an anode and as a reflective electrode, and the emission layer 24.

Here, discussion concerning optical interference is performed in the same manner as in the first embodiment with an organic EL element whose construction ranging from the reflective electrode (lower electrode 21) to the emission layer is the same as that of the organic EL element 2 of FIG. 6.

Here, upon performance of the discussion concerning optical interference, the following organic EL element was used: three kinds of hole injection/transport layers, i.e., the HTL1, the HTL2, and an HTL3 were placed between the anode as the reflective electrode and the emission layer so that the HTL1 was on a reflective electrode side and the HTL3 was on a emission layer side. Here, the HTL1 corresponds to the fourth charge injection/transport layer 27 of FIG. 6, the HTL2 corresponds to the first charge injection/transport layer 22 of FIG. 6, and the HTL3 corresponds to the second charge injection/transport layer 23 of FIG. 6. In addition, the fourth charge injection/transport layer 27 (HTL1) is a layer in contact with the first charge injection/transport layer 22 (HTL2) on the reflective electrode side, and is a layer (low-refractive index layer) having a refractive index lower than those of the emission layer 24 and the first charge injection/transport layer 22 (HTL2). In other words, the construction in this embodiment is such that two low-refractive index layers (the second charge injection/transport layer 23 (HTL3) and the fourth charge injection/transport layer 27 (HTL1)) are provided between the emission layer 24 and the reflective electrode 21.

In addition, the refractive index of each of the HTL2 and the emission layer at λ=460 nm was set to 1.85. In addition, the following simulation is performed on the premise that the optical path L1 in this embodiment satisfies the expression (1). In addition, an emission region present in the emission layer is assumed to localize toward the hole injection/transport layer (HTL3), and the maximum emission surface in the emission layer is assumed to be positioned at 2 nm from an interface between the emission layer and the HTL3. In addition, the simulation was performed by the same approach as that of Non Patent Literature 1, and with regard to internal quantum efficiency, exciton production efficiency was set to 25% and an emission yield was set to 80%.

The organic EL element used in the simulation is such that the refractive index of each of the HTL1 and the HTL3 is different from (a refractive index lower than) those of the HTL2 and the emission layer. Accordingly, two interfaces of the HTL3 (an interface on the emission layer side and an interface on the HTL2 side), and the interface of the HTL1 on the HTL2 side can be reflection interfaces. Here, Table 5 below summarizes a condition for the optical path ($L_2$ or $L_3$) from the maximum emission surface of the emission layer to each reflection interface to satisfy the expression (2) or the expression (3).

TABLE 5

| Reflection interface | Order | Maximum [nm] | Middle value [nm] | Minimum [nm] |
|---|---|---|---|---|
| Emission layer/HTL3 | p = 0 | 57.5 | 0 | (−57.5)$^{(Note)}$ |
| HTL3/HTL2 | q = 0 | 172.5 | 115 | 57.5 |
| HTL2/HTL1 | p = 1 | 172.5 | 230 | 287.5 |

$^{(Note)}$The substantial minimum is 0 nm because the optical path does not become negative.

By the way, the optical path from the maximum emission surface of the emission layer to the emission layer/HTL3 reflection interface is 3.7 nm and hence satisfies the condition of the present invention as is understood from Table 5 above. Next, the thickness of the HTL3 for the optical path from the maximum emission surface of the emission layer to the HTL3/HTL2 reflection interface to satisfy the requirement of the present invention is (115−3.7)/$n_{HTL3}$ where $n_{HTL3}$ represents the refractive index of the HTL3. Further, the thickness of the HTL2 for the optical path from the maximum emission surface of the emission layer to the HTL2/HTL1 reflection interface to satisfy the requirement of the present invention is determined to be (230−115)/1.85=62.2 nm. It is to be noted that the thickness of the HTL3 has only to be optimized so that emission efficiency may become maximum to the extent that the requirement of the expression (1) is satisfied. In this embodiment, the optimization is performed while m in the expression (1) is set to 1.

Table 6 below summarizes a relationship between the refractive indices and thicknesses of the HTL1 and the HTL3, and the emission efficiency in this embodiment.

TABLE 6

| | | Embodiment 2A | Embodiment 2B | Embodiment 2C | Conventional form |
|---|---|---|---|---|---|
| HTL3 | Refractive index | 1.6 | 1.75 | 1.75 | — |
| | Film thickness [nm] | 70 | 64 | 10 | — |
| HTL2 | Refractive index | 1.85 | 1.85 | 1.85 | 1.85 |
| | Film thickness [nm] | 62 | 62 | 113 | 150 |
| HTL1 | Refractive index | 1.6 | 1.75 | 1.75 | — |
| | Film thickness [nm] | 26 | 26 | 29 | — |
| Ag | Film thickness [nm] | 150 | 150 | 150 | 150 |
| | Emission efficiency [cd/A] | 5.2 | 4.4 | 4.0 | 3.8 |

With regard to each of the embodiment 2A and embodiment 2B in Table 6, the expression (2) or the expression (3) is satisfied at all three reflection interfaces shown in Table 5, and as can be seen from Table 6 above, each of the embodiments has efficiency higher than that of the conventional form. In addition, with regard to the embodiment 2C, the emission layer/HTL3 interface and the HTL2/HTL1 interface satisfy the expression (2) shown in Table 5, but the HTL3/HTL2 interface does not satisfy the expression (3) shown in Table 5. Therefore, it is found that the embodiment 2C has efficiency higher than that of the conventional form, though the efficiency is not as high as that of the embodiment 2B similarly formed of two low-refractive index layers.

Third Embodiment

Figure 7:
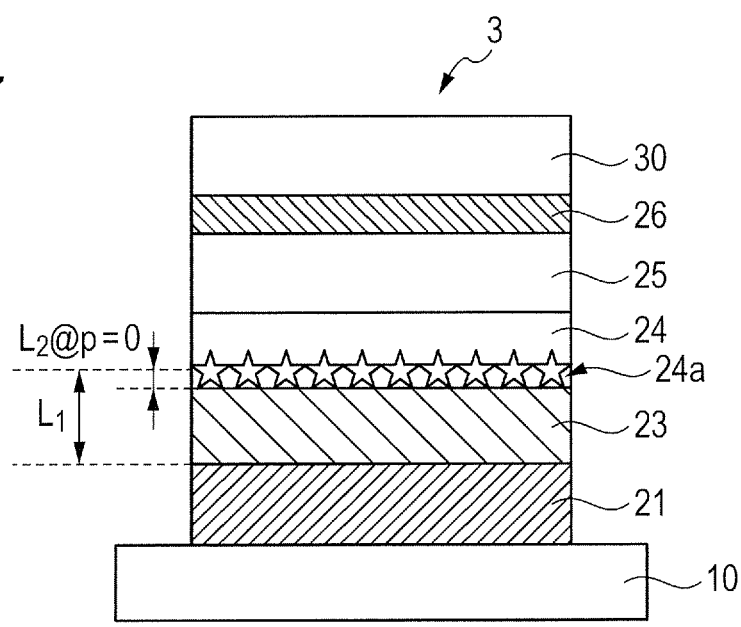
FIG. 7 is a schematic sectional view illustrating a third embodiment in the organic EL element of the present invention.

FIG. 7 is a schematic sectional view illustrating a third embodiment in the organic EL element of the present invention. An organic EL element 3 of FIG. 7 is of the same construction as that of the organic EL element 1 of FIG. 1 with the exception that only the second charge injection/transport layer 23 is provided between the lower electrode 21 and the emission layer (the first charge injection/transport layer 22 in FIG. 1 is not provided between the lower electrode 21 and the emission layer 24) in the organic EL element 1 of FIG. 1.

In the construction as well, an improvement in emission efficiency can be achieved by satisfying the expression (1) (preferably the expression (1')) and the expression (2) or the expression (2') (preferably the expression (2")).

[Application of Organic EL Element]

The organic EL element of the present invention is applicable to a light-emitting apparatus. The light-emitting apparatus is applicable to various applications such as lighting, a printer head, an exposure apparatus, and a backlight for a display apparatus. The printer head has a construction in which the multiple organic EL elements of the present invention are arrayed in a substantially one-dimensional direction.

Figure 8:
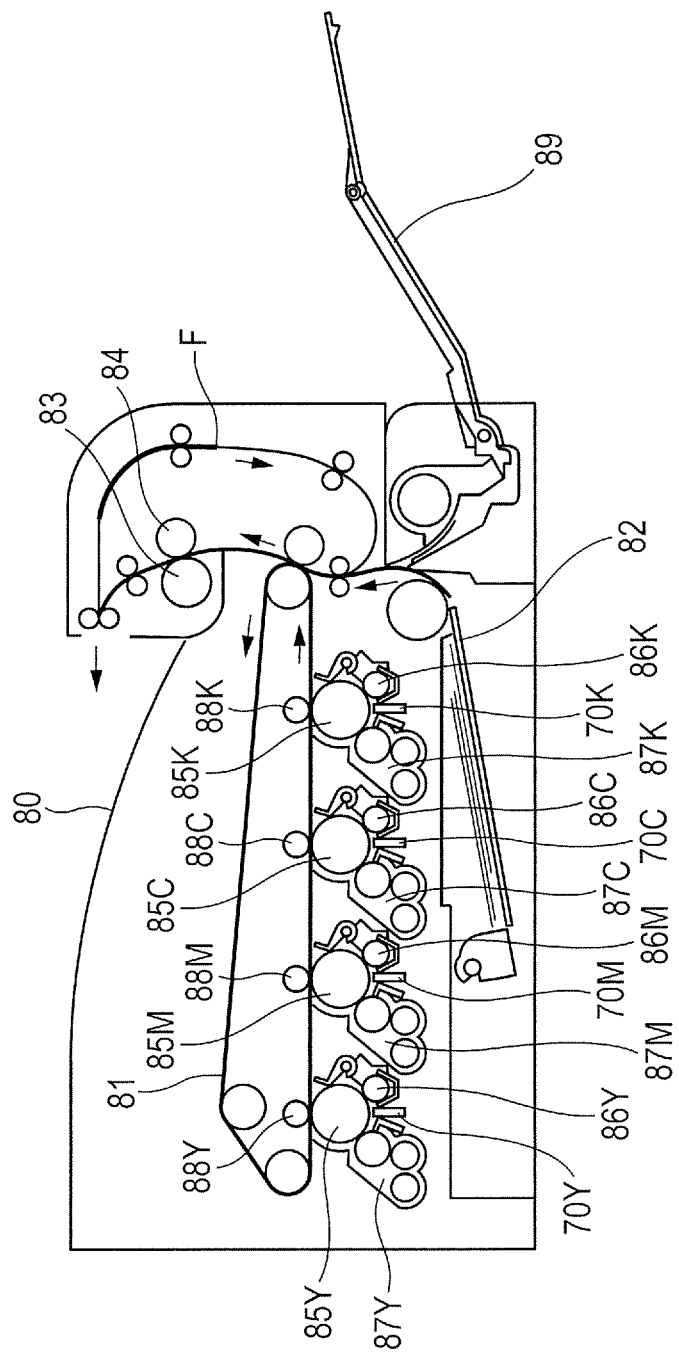
FIG. 8 is a schematic sectional view illustrating an example of an image-forming apparatus including the organic EL element of the present invention.

An image-forming apparatus including the printer head as an exposure light source is described. FIG. 8 is a schematic sectional view illustrating an example of an image-forming apparatus including the organic EL element of the present invention. The image-forming apparatus of FIG. 8 can selectively perform: a color mode in which toners of four colors, i.e., yellow (Y), magenta (M), cyan (C), and black (K) toners are superimposed to form a color image; and a monochromatic mode in which a monochromatic image is formed by using the black (K) toner alone. It is to be noted that FIG. 8 is a sectional view of a main portion in a sub-scanning direction. In the image-forming apparatus, when code data Dc is input from an external device such as a personal computer to a print controller (not shown), the code data Dc is converted into image data (dot data) Di. The image data Di is input to each of exposure units 70Y, 70M, 70C, and 70K built in the image-forming apparatus. Then, the exposure units 70Y, 70M, 70C, and 70K are each controlled based on the image data Di.

The exposure unit 70Y includes: a light-emitting apparatus according to this embodiment; and a lens for condensing light emitted from the light-emitting apparatus to irradiate the surface of a photosensitive drum 85Y with exposure light. In addition, the exposure unit 70Y may include a light-absorbing member so that a position except a predetermined position on the surface of the photosensitive drum 85Y may not be irradiated with the light.

In addition to the exposure units (70Y, 70M, 70C, and 70K), the print controller, a transfer belt 81, a sheet-feeding unit 82, a fixing roller 83, and a pressure roller 84 are placed in a casing 80 of the image-forming apparatus. Further, photosensitive drums (85Y, 85M, 85C, and 85K), charging rollers (86Y, 86M, 86C, and 86K), developing devices (87Y, 87M, 87C, and 87K), and transfer rollers (88Y, 88M, 88C, and 88K) are placed in the casing 80. In the image-forming apparatus of FIG. 8, the sheet-feeding unit 82 is removably mounted.

An image-forming operation is as described below. Although the case where a yellow (Y) image is formed as a latent image is described in the following description, respective magenta (M), cyan (C), and black (K) images are sequentially formed in the same manner as in the formation of the yellow (Y) image upon conveyance of paper by the transfer belt 81.

First, the photosensitive drum 85Y as an electrostatic latent image-bearing member is rotated clockwise by a motor (not shown) based on a signal from the print controller. Then, in association with the rotation, each photosensitive surface of the photosensitive drum 85Y rotates with respect to each exposure light. The charging roller 86Y for charging the surface of the photosensitive drum 85Y according to a desired pattern is provided below the photosensitive drum 85Y so as to abut on the surface. Then, the surface of the photosensitive drum 85Y uniformly charged by the charging roller 86Y is irradiated with exposure light by the exposure unit 70Y.

The irradiation position, irradiation timing, irradiation time, irradiation intensity, and the like of the exposure light emitted from the exposure unit 70Y are adjusted based on the image data Di, and then an electrostatic latent image is formed on the surface of the photosensitive drum 85Y by the exposure light. The electrostatic latent image is developed as a toner image by the developing device 87Y provided on a downstream side in the rotation direction of the photosensitive drum 85Y relative to the irradiation position of the exposure light so as to abut on the photosensitive drum 85Y.

The toner image developed by the developing device 87Y is transferred onto the paper as a transfer material by the transfer roller 88Y provided below the photosensitive drum 85Y so as to be opposite to the photosensitive drum 85Y. The paper, which is stored in a paper cassette in the sheet-feeding unit 82, can also be fed with a manual bypass tray. A sheet-feeding roller is provided at an end portion of the paper cassette and feeds the paper in the paper cassette into a conveyance path.

Thus, the paper onto which the toner image has been transferred is conveyed to a fixing device by the transfer belt 81. The fixing device is constituted of the fixing roller 83 including a fixing heater (not shown) in itself and the pressure roller 84 provided so as to be in pressure contact with the fixing roller 83, and the device fixes the toner image on the conveyed paper by heating the paper while pressurizing the paper with the fixing roller 83 and the pressure roller 84.

As described above, the image-forming apparatus includes the organic EL element of the present invention, a photosensitive member on the surface of which a latent image is formed by the organic EL element, and a charging unit for charging the photosensitive member.

Figure 9:
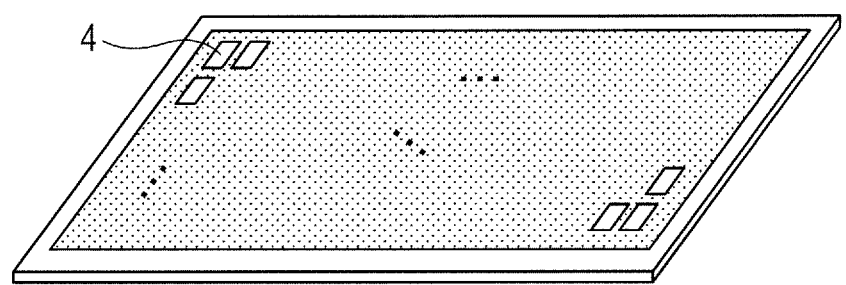
FIG. 9 is a schematic sectional view illustrating an example of a display apparatus including the organic EL element of the present invention.

FIG. 9 is a schematic sectional view illustrating an example of a display apparatus including the organic EL element of the present invention. As illustrated in FIG. 9, the organic EL element of the present invention can be used as a constituent member for a pixel 4 in the display apparatus. In other words, the display apparatus includes multiple organic EL elements and a drive circuit for driving the organic EL elements. In addition, in the display apparatus, the multiple organic EL elements are preferably placed in a two-dimensional manner.

A specific construction of the display apparatus is desirably as follows: multiple pixel units are arrayed in a matrix manner, and each pixel unit is constituted of multiple pixels having different luminescent colors such as a red-light-emitting pixel, a green-light-emitting pixel, and a blue-light-emitting pixel. In other words, the red-light-emitting pixel includes an organic EL element that emits red light.

It is to be noted that the term "pixel" as used in the present invention refers to the minimum unit whose light emission can be independently controlled. In addition, the term "pixel unit" refers to the minimum unit that: is constituted of multiple pixels having different luminescent colors; and can emit light having a desired color through the color mixing of the respective pixels.

In this embodiment, all pixels may each be the organic EL element of the present invention or only part of the pixels may each be the organic EL element of the present invention. That is, a construction in which both the organic EL element of the present invention and the conventional organic EL element are present is permitted. In this case, the emission characteristics of the display apparatus can be adjusted by adjusting a ratio between both the elements.

In addition, when both the elements are present as described above, the organic EL element of the present invention and the conventional organic EL element may be regularly arrayed. Alternatively, the organic EL elements of the present invention may be irregularly placed in a scattered manner.

It is to be noted that a pixel may be provided with a unit for improving light extraction efficiency. The unit may be provided in each of the pixels or may be provided only in a specific pixel.

Examples of the display apparatus include a television set, the display of a personal computer, the back-surface display portion of an imaging apparatus, the display portion of a portable telephone, and the display portion of a portable game machine. Further examples thereof include the display portion of a portable music-reproducing apparatus, the display portion of a personal digital assistant (PDA), and the display portion of a car navigation system.

Figure 10:
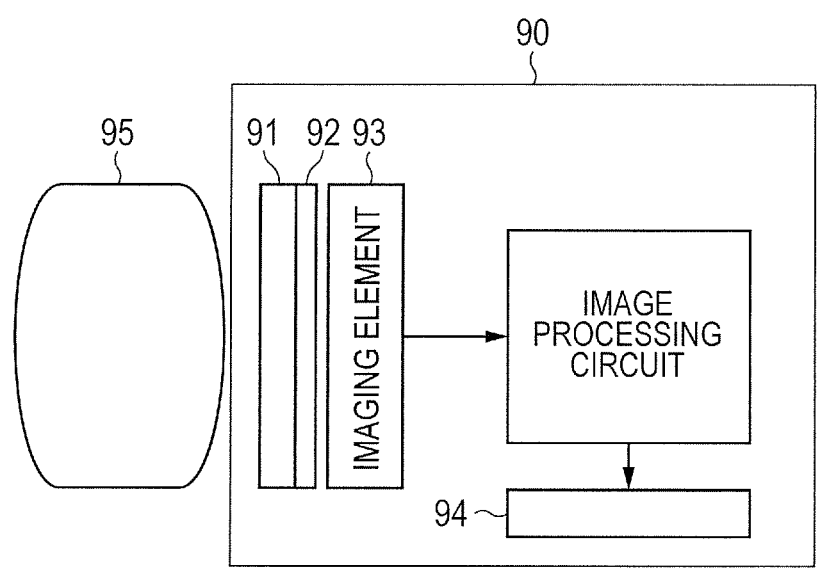
FIG. 10 is a schematic sectional view illustrating an example of an imaging apparatus including the organic EL element of the present invention.

FIG. 10 is a schematic sectional view illustrating an example of an imaging apparatus including the organic EL element of the present invention. The imaging apparatus of FIG. 10 includes a display apparatus 94 including the organic EL element, and includes, in a casing 90, a low-pass filter 91, an infrared cut filter 92, and an imaging element 93 such as a CMOS sensor. The display apparatus 94 is placed in the casing 90 of the imaging apparatus, and can display an image photographed with the imaging element 93 and imaged with an image processing circuit. In addition, in FIG. 10, a lens 95 is provided outside the casing 90 of the imaging apparatus, and the lens 95 is removably mounted onto the casing 90. It is to be noted that the display apparatus according to this embodiment is also applicable to such an imaging apparatus in which the casing 90 and the lens are integrally provided.

Example 1

An organic EL element (blue organic EL element) of FIG. 1 was produced by the following method. It is to be noted that part of the materials used in this example are shown below.

Compound 4

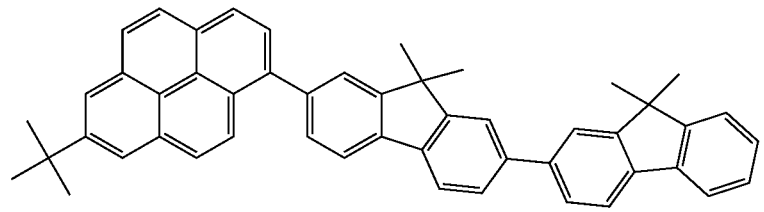

Compound 5

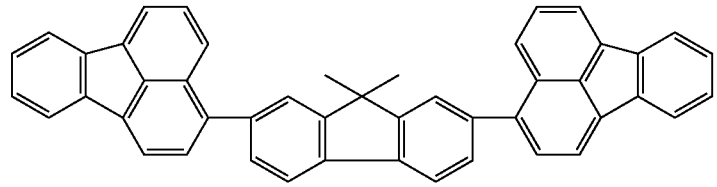

Compound 6

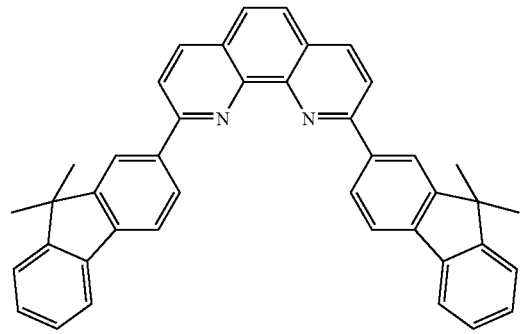

Compound 7

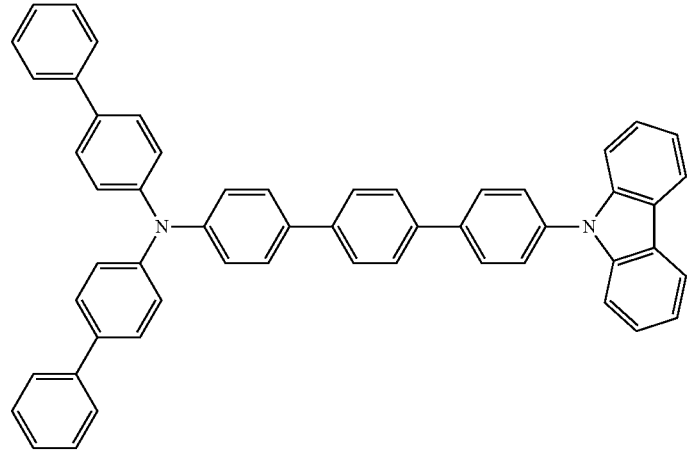

(1) Step of Producing Substrate

First, a TFT drive circuit (not shown) formed of low-temperature polysilicon was formed on a glass base material. Next, an acrylic resin was formed into a film on the TFT drive circuit to form a planarizing film (not shown). The substrate 10 including the base material, the TFT drive circuit provided on the base material, and the planarizing film covering the TFT drive circuit produced as described above was used in the next step.

(2) Step of Forming Lower Electrode

Next, an Ag alloy was formed into a film on the substrate 10 by a sputtering method to form an Ag alloy film. At this time, the thickness of the Ag alloy film was set to 150 nm. Next, an iridium tin oxide (ITO) was formed into a film on the Ag alloy film by the sputtering method to form an ITO film. At this time, the thickness of the ITO film was set to 5 nm. Next, a laminated electrode film formed of the Ag alloy film and the ITO film was subjected to patterning according to an emission region. Thus, the lower electrode 21 (reflective electrode) having a predetermined pattern shape was formed. Next, a polyimide-based resin was formed into a film by a spin coating method to form an insulating layer. Next, the insulating layer was subjected to patterning by a photolithography method so that an opening was formed in a region where an organic EL element was to be provided, whereby an element isolation film was formed.

(3) Step of Forming Hole Injection/Transport Layer or the Like

Next, Compound 1 was formed into a film on the lower electrode 21 by a vacuum deposition method to form a first hole injection/transport layer (the first charge injection/transport layer 22). At this time, the first hole injection/transport layer had a thickness of 85 nm and a refractive index (n) at $\lambda=460$ nm of 1.9.

Next, Compound 1 and LiF were codeposited from the vapor at a mass mixing ratio of 60:40 onto the first hole injection/transport layer (first charge injection/transport layer 22) to form a second hole injection/transport layer (the second charge injection/transport layer 23). At this time, the second hole injection/transport layer had a thickness of 50 nm and a refractive index (n) at $\lambda=460$ nm of 1.72. It is to be noted that the second hole injection/transport layer (second charge injection/transport layer 23) functions as a low-refractive index layer having a refractive index lower than that of an adjacent layer by 0.1 or more.

Next, Compound 7 was formed into a film serving as an intervening layer on the second hole injection/transport layer (second charge injection/transport layer 23) by a vacuum deposition method to form an electron-blocking layer (not shown). At this time, the electron-blocking layer had a thickness of 10 nm and a refractive index (n) at $\lambda=460$ nm of 1.99.

(4) Step of Forming Emission Layer

Next, Compound 4 (host) and Compound 5 (guest) were codeposited from the vapor onto the electron-blocking layer to form the emission layer 24. At this time, the emission layer 24 had a thickness of 15 nm, the film formation rates of the host and the dopant were 0.98 Å/s and 0.02 Å/s, respectively, and the layer had a refractive index (n) at $\lambda=460$ nm of 1.85.

(5) Step of Forming Electron Injection/Transport Layer or the Like

Next, Compound 6 was formed into a film on the emission layer 24 by a vacuum deposition method to form an electron injection/transport layer (the third charge injection/transport layer 25). At this time, the thickness of the electron injection/transport layer (third charge injection/transport layer 25) was set to 20 nm. Next, in order for electron injection property to be secured, Compound 6 and Cs were codeposited from the vapor onto the electron injection/transport layer (third charge injection/transport layer 25) to form an electron injection layer (not shown). At this time, the thickness of the electron injection layer was set to 20 nm.

(6) Step of Forming Upper Electrode and Other Steps

Next, Ag was formed into a film on the electron injection layer by a sputtering method to form the upper electrode 26. At this time, the thickness of the upper electrode 26 was set to 12 nm. Finally, Alq$_3$ was formed into a film on the upper electrode 26 to form the optical adjustment layer 30. At this time, the thickness of the optical adjustment layer 30 was set to 70 nm.

Finally, sealing glass (not shown) containing a desiccant and the film formation surface of the glass substrate were sealed with a UV-curable resin in a glove box in which a nitrogen atmosphere had been established. Thus, the organic EL element was obtained.

(7) Evaluation of Element

In the organic EL element produced in this example, the electron-blocking layer is provided between the emission layer 24 and the low-refractive index layer (second charge injection/transport layer 23). However, the electron-blocking layer does not affect an interference condition as one requirement of the present invention. This is because of a reason described below.

The organic EL element produced in this example includes one low-refractive index layer, and hence each of p in the expression (2) and q in the expression (3) equals 0. Here, if it is assumed that the maximum emission surface 24a of the emission layer is present at the center of the emission layer 24, the expression (2) is established between the $L_2$ and $\lambda$, and the expression (3) is established between the $L_3$ and $\lambda$. In addition, even when the maximum emission surface 24a of the emission layer is present at a position except the center of the emission layer 24, the expression (2) is established between the $L_2$ and $\lambda$, and the expression (3) is established between the $L_3$ and $\lambda$ as long as the maximum emission surface 24a of the emission layer is present in the emission layer 24.

The emission efficiency of the organic EL element obtained in this example was 4.3 cd/A.

Comparative Example 1

An organic EL element was obtained by the same method as that of Example 1 with the exception that in Example 1, Compound 1 was formed into a film having a thickness of 135 nm to serve as the first charge injection/transport layer 22 and Compound 7 was formed into a film having a thickness of 10 nm to serve as the second charge injection/transport layer 23.

The emission efficiency of the resultant organic EL element was 3.9 cd/A in the same chromaticity coordinates as those of Example 1. Therefore, it was confirmed that the organic EL element of Example 1 had higher efficiency.

Example 2

The organic EL element 2 (blue organic EL element) of FIG. 6 was produced by a method described below.

(1) Step of Producing Substrate

First, the substrate 10 was produced by the same method as Example 1.

(2) Step of Forming Lower Electrode

Next, an Ag alloy was formed into a film on the substrate 10 by a sputtering method to form an Ag alloy film. At this time, the thickness of the Ag alloy film was set to 150 nm. Next, the Ag alloy film was subjected to patterning according to an emission region. Thus, the lower electrode 21 (reflective electrode) having a predetermined pattern shape was formed. Next, a polyimide-based resin was formed into a film by a spin coating method to form an insulating layer. Next, the insulating layer was subjected to patterning by a photolithography method so that an opening was formed in a region where an organic EL element was to be provided, whereby an element isolation film was formed.

(3) Step of Forming Hole Injection/Transport Layer or the Like

Next, Compound 2 (having a refractive index n at λ=460 nm of 1.65) as a hole transport material functioning as a first low-refractive index layer, Compound 1 (having a refractive index n at λ=460 nm of 1.99), and Compound 2 as a second low-refractive index layer were sequentially formed into films having thicknesses of 35 nm, 60 nm, and 65 nm, respectively by vapor deposition.

(4) Step of Forming Emission Layer

The emission layer 24 was formed by the same method as that of Example 1.

(5) Step of Forming Electron Injection/Transport Layer or the Like

The electron injection/transport layer (third charge injection/transport layer) 25 and an electron transport layer to be formed on the electron injection/transport layer were formed by the same method as that of Example 1.

(6) Step of Forming Upper Electrode and Other Steps

The upper electrode 26 and the optical adjustment layer 30 were sequentially formed by the same method as that of Example 1. After that, the same sealing treatment as that of Example 1 was performed to provide the organic EL element.

(7) Evaluation of Element

The emission efficiency of the resultant organic EL element was 5.2 cd/A in the same chromaticity coordinates as those of Example 1. Thus, it was confirmed that the organic EL element of this example had efficiency higher than that of the organic EL element of Comparative Example 1.

Example 3

An organic EL element (blue organic EL element) in which each organic layer between a reflective electrode and an emission layer was formed of a low-refractive index layer was produced by a method described below.

(1) Step of Producing Substrate

The substrate 10 was produced by the same method as Example 2.

(2) Step of Forming Lower Electrode

A lower electrode was produced by the same method as Example 2.

(3) Step of Forming Hole Injection/Transport Layer or the Like

Compound 1 and LiF were codeposited from the vapor at a mass mixing ratio of 60:40 to form a hole injection/transport layer. At this time, the layer had a thickness of 162 nm and a refractive index (n) at λ=460 nm of 1.72. It is to be noted that the hole injection/transport layer formed in this step functions as a low-refractive index layer having a refractive index lower than that of the emission layer by 0.1 or more.

(4) Step of Forming Emission Layer

The emission layer 24 was formed by the same method as that of Example 1.

(5) Step of Forming Electron Injection/Transport Layer or the Like

The electron injection/transport layer (third charge injection/transport layer) 25 and an electron transport layer to be formed on the electron injection/transport layer were formed by the same method as that of Example 1.

(6) Step of Forming Upper Electrode and Other Step

The upper electrode 26 and the optical adjustment layer 30 were sequentially formed by the same method as that of Example 1. After that, the same sealing treatment as that of Example 1 was performed to provide the organic EL element.

(7) Evaluation of Element

The emission efficiency of the resultant organic EL element was 4.5 cd/A in the same chromaticity coordinates as those of Example 1 and Example 2. Thus, it was confirmed that the organic EL element according to this example has efficiency higher than that of the organic EL element of Comparative Example 1.

REFERENCE SIGNS LIST 1 (2, 3) organic EL element
10 substrate
21 lower electrode (reflective electrode, anode)
22 first charge injection/transport layer (hole injection/transport layer)
23 second charge injection/transport layer (hole injection/transport layer, low-refractive index layer)
24 emission layer
24a maximum emission surface (of emission layer)
25 third charge injection/transport layer (electron injection/transport layer)
26 upper electrode (light exiting side electrode, cathode)
30 optical adjustment layer

ADVANTAGEOUS EFFECTS OF INVENTION

According to the present invention, it is possible to provide the organic EL element improved in emission efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-084661, filed Apr. 15, 2013, which is hereby incorporated by reference herein in its entirety.

The invention claimed is:

1. An organic electroluminescence element comprising:
a reflective electrode;
a light exiting side electrode;
an emission layer provided between the reflective electrode and the light exiting side electrode;
at least one low-refractive index layer provided between the reflective electrode and the emission layer, a refractive index of the low-refractive index layer being lower than that of the emission layer; and
a charge injection/transport layer disposed between the reflective electrode and the low-refractive index layer, a refractive index of the charge injection/transport layer being higher than that of the low-refractive index layer, wherein an optical path $L_1$ between a maximum emission surface of the emission layer and a reflection surface of the reflective electrode satisfies the following expression (1):

$$\left(4m - 1 - \frac{\phi}{90}\right) \times \left(\frac{\lambda}{8}\right) < L_1 < \left(4m + 1 - \frac{\phi}{90}\right) \times \left(\frac{\lambda}{8}\right) \quad (1)$$

in the expression (1), $\lambda$ represents a maximum peak wavelength of an emission spectrum, $\phi$ represents a phase shift [deg] on the reflection surface of the reflective electrode, and m represents a positive integer; and wherein an optical path $L_2$ between an interface on an emission layer side of the low-refractive index layer closest to the emission layer and the maximum emission surface of the emission layer satisfies the following expression (2'):

$$0 \leq L_2 < \frac{\lambda}{8} \quad (2')$$

in the expression (2'), $\lambda$ represents the maximum peak wavelength of the emission spectrum.

2. The organic electroluminescence element according to claim 1, wherein the optical path $L_1$ satisfies the following expression (1'):

$$\left(8m - 1 - \frac{\phi}{45}\right) \times \left(\frac{\lambda}{16}\right) \leq L_1 \leq \left(8m + 1 - \frac{\phi}{45}\right) \times \left(\frac{\lambda}{16}\right). \quad (1')$$

3. The organic electroluminescence element according to claim 1, wherein the m represents 1.

4. The organic electroluminescence element according to claim 1, wherein the optical path $L_2$ satisfies the following expression (2"):

$$0 \leq L_2 \leq \frac{\lambda}{16} \quad (2'')$$

in the expression (2"), $\lambda$ represents the maximum peak wavelength of the emission spectrum.

5. The organic electroluminescence element according to claim 1, wherein an optical path $L_3$ between the charge injection/transport layer and the low-refractive index layer, and the maximum emission surface of the emission layer satisfies the following expression (3):

$$(4q + 1) \times \frac{\lambda}{8} < L_3 < (4q + 3) \times \frac{\lambda}{8}. \quad (3)$$

6. The organic electroluminescence element according to claim 5, wherein the optical path $L_3$ satisfies the following expression (3'):

$$(8q + 3) \times \frac{\lambda}{16} \leq L_3 \leq (8q + 5) \times \frac{\lambda}{16} \quad (3')$$

in the expression (3'), $\lambda$ represents the maximum peak wavelength of the emission spectrum and q represents 0 or a positive integer.

7. The organic electroluminescence element according to claim 5, wherein the q represents 0.

8. The organic electroluminescence element according to claim 1, further comprising another low-refractive index layer disposed between the reflective electrode and the charge injection/transport layer, a refractive index of the another low-refractive index layer being lower than those of the emission layer and the charge injection/transport layer.

9. The organic electroluminescence element according to claim 8, wherein the optical path $L_2$ between an interface of the another low-refractive index layer and the charge injection/transport layer, and the maximum emission surface of the emission layer satisfies one of the following expression (2) and the following expression (2a):

$$(4p - 1) \times \frac{\lambda}{8} < L_2 < (4p + 1) \times \frac{\lambda}{8} \quad (2)$$

$$(8p - 1) \times \frac{\lambda}{16} \leq L_2 \leq (8p + 1) \times \frac{\lambda}{16} \quad (2a)$$

and a relationship of $p \geq 1$ is satisfied in one of the expression (2) and the expression (2a).

10. The organic electroluminescence element according to claim 9, wherein the p represents 1.

11. The organic electroluminescence element according to claim 1, further comprising an intervening layer disposed between the low-refractive index layer and the emission layer.

12. The organic electroluminescence element according to claim 1, wherein a thickness of the low-refractive index layer is more than $\frac{1}{8}\lambda$ and less than $\frac{3}{8}\lambda$ in terms of an optical path length.

13. An image-forming apparatus comprising:
the organic electroluminescence element according to claim 1;
a photosensitive member on a surface of which a latent image is formed by the organic electroluminescence element; and
a charging unit for charging the photosensitive member.

14. A display apparatus comprising:
the organic electroluminescence element according to claim 1; and
a drive circuit for driving the organic electroluminescence element.

15. An imaging apparatus comprising:
the display apparatus according to claim 14; and
an imaging element.

* * * * *